US011056185B2

(12) United States Patent
Narayanan et al.

(10) Patent No.: US 11,056,185 B2
(45) Date of Patent: Jul. 6, 2021

(54) APPARATUS FOR DEEP LEARNING OPERATIONS ON RESISTIVE CROSSBAR ARRAY

(71) Applicant: INTERNATIONAL BUSINESS MACHINES CORPORATION, Armonk, NY (US)

(72) Inventors: Pritish Narayanan, San Jose, CA (US); Scott C Lewis, Essex Junction, VT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 341 days.

(21) Appl. No.: 16/159,211

(22) Filed: Oct. 12, 2018

(65) Prior Publication Data
US 2020/0118619 A1 Apr. 16, 2020

(51) Int. Cl.
*G11C 11/54* (2006.01)
*G06N 3/063* (2006.01)
(Continued)

(52) U.S. Cl.
CPC .......... *G11C 11/54* (2013.01); *G06N 3/0635* (2013.01); *G11C 13/003* (2013.01); (Continued)

(58) Field of Classification Search
CPC ... G11C 11/54; G11C 13/0028; G11C 13/003; G11C 13/0026; G11C 13/004;
(Continued)

(56) References Cited

U.S. PATENT DOCUMENTS 8,311,965 B2 11/2012 Breitwisch et al.
9,852,790 B1* 12/2017 Gokmen ................ G06N 3/084
(Continued)

FOREIGN PATENT DOCUMENTS

WO 2016167778 A1 10/2016

OTHER PUBLICATIONS

G.W. Burr et al., "Large-scale neural networks implemented with non-volatile memory as the synaptic weight element: comparative performance analysis (accuracy, speed, and power)," 2015 IEEE International Electron Devices Meeting (IEDM), Washington, DC, Dec. 7-9, 2015, pp. 4.4.1-4.4.4.
(Continued)

*Primary Examiner* — Tri M Hoang
(74) *Attorney, Agent, or Firm* — Erik A. Huestis; Stephen J. Kenny; Foley Hoag LLP

(57) ABSTRACT

A system and method are shown for both forward and reverse read operations in a neuromorphic crossbar array that is part of an artificial neural network (ANN). During a forward read operation, a plurality of neuron activations are encoded into a pulse width drive array word line that gates a cell access transistor. A source-follower transistor is biased at a source follower voltage (VRDP) and a column voltage node (BLV) is held at read voltage (VREAD). During a reverse read operation, the cell access transistor operates as another source follower by: encoding a neuron error signal into the column voltage node (BLV), driving a gate line of the cell access transistor to the source follower voltage (VRDP), and holding an intermediate node between the cell access transistor of (a) and the source-follower transistor of (b) at the read voltage (VREAD).

23 Claims, 7 Drawing Sheets

(51) Int. Cl.
*H01L 27/24* (2006.01)
*G11C 13/00* (2006.01)

(52) U.S. Cl.
CPC ........ *G11C 13/004* (2013.01); *G11C 13/0026* (2013.01); *G11C 13/0028* (2013.01); *H01L 27/2463* (2013.01)

(58) Field of Classification Search
CPC .............. G11C 7/1006; G11C 2213/82; G11C 2213/79; G11C 2213/74; G06N 3/0635; G06N 3/084; G06N 3/049; H01L 27/2463
See application file for complete search history.

(56) References Cited

U.S. PATENT DOCUMENTS

| | | | | |
|---|---|---|---|---|
| 10,528,643 | B1* | 1/2020 | Choi | G06F 17/16 |
| 10,534,840 | B1* | 1/2020 | Petti | G06N 3/04 |
| 10,593,403 | B2* | 3/2020 | Buchanan | G11C 13/003 |
| 2017/0098156 | A1* | 4/2017 | Nino | G06N 3/049 |
| 2019/0035449 | A1* | 1/2019 | Saida | G11C 11/161 |
| 2019/0103162 | A1* | 4/2019 | Asnaashari | G11C 8/12 |

OTHER PUBLICATIONS

G.W. Burr et al., "Experimental Demonstration and Tolerancing of a Large-Scale Neural Network (165 000 Synapses) Using Phase-Change Memory as the Synaptic Weight Element," IEEE Transactions on Electron Devices, 62(11), Nov. 2015, pp. 3498-3507.
G.W. Burr et al., "Neuromorphic computing using non-volatile memory," Advances in Physics: X, 2017, 2(1), pp. 89-124.

* cited by examiner

APPARATUS FOR DEEP LEARNING OPERATIONS ON RESISTIVE CROSSBAR ARRAY

BACKGROUND OF THE INVENTION

Field of Invention

The present invention relates generally to the field of artificial neural networks (ANN). More specifically, the present invention is related to method and apparatus for executing forward and reverse propagate operations on a resistive crossbar array-based neural network.

Discussion of Related Art

Non-volatile memory-based crossbar arrays can be used in neuromorphic non-von Neumann computing schemes, for example in multi-layer perceptrons trained using backpropagation (see FIG. 1), potentially achieving orders of magnitude power and performance benefits over software implementations. Here, programmable synaptic elements based on non-volatile memory devices serve as analog weights (shown as $w_{ij}$ in FIG. 1), whose conductances are tuned by training over large datasets to achieve high accuracies on a range of tasks such as image and speech recognition. Computation (specifically highly efficient multiply-accumulate (MACC) operations) can be achieved at the location of the data in a massively-parallel analog operation using the physics of the devices (Ohm's law for multiply) and the circuit (Kirchhoff's current law for accumulate).

Training of neural networks requires multiply-accumulate operations for both forward and reverse propagation tasks (see FIG. 2). FIG. 2 depicts the forward and reverse evaluate operations in one fully-connected layer of an Artificial Neural Network (ANN). The fully connected layer has input and output neurons, represented by the solid and dotted circles respectively. Each neuron has a unique activation associated with it. In FIG. 2, $x^A_1, x^A_2, x^A_3 \ldots x^A_N$ represent 'N' different input neuron activations, a 'generic' activation belonging to this set is represented by $x^A_i$. Also, in FIG. 2, $x^B_1, x^B_2, x^B_3 \ldots x^B_M$ represent 'M' different output neuron activations; a 'generic' activation belonging to this set is represented by $x^B_j$. Each pair of neurons is connected by a unique weight, and for N input neurons and M output neurons, there are a total of N×M activations (accordingly, the term 'fully-connected'). A 'generic' weight, connecting the $i^{th}$ input neuron to the $j^{th}$ output neuron is represented by $w_{ij}$. During forward propagate, every output neuron activation is calculated based on the accumulated sum of all the input neurons multiplied by their corresponding weights, followed by the application of a non-linear function $f(\ )$ to this accumulated sum. In typical neural networks, $f$ could be tanh, logistic function, or Rectified Linear Unit. During reverse propagate, data flow is from output to input neurons, where 'errors' are introduced. In FIG. 2, $\delta^A_1, \delta^A_2, \delta^A_3 \ldots \delta^A_N$ represent 'N' different input neuron errors, a 'generic' error belonging to this set is represented by $\delta^A_i$. In FIG. 2, $\delta^B_1, \delta^B_2, \delta^B_3 \ldots \delta^B_M$ represent 'M' different output neuron errors, a 'generic' error belonging to this set is represented by $\delta^B_j$. During reverse propagate, every input neuron error is calculated based on the accumulated sum of all the output errors multiplied by their corresponding weights, followed by the multiplication of the derivative of the non-linear function (denoted by $f'(\ )$ applied at the value of the input neuron activation ($f'(x^A_i)$) to this accumulated sum.

On a crossbar array, this implies that current accumulation would need to be in one direction for forward propagation (say from West to South, performed along the columns) and in the orthogonal/opposite direction for reverse propagation (say from South to West, performed along the rows). This contrasts with a conventional memory where read-outs are typically in one direction only. We disclose a method for read out along both forward and reverse directions without the need for additional array transistors (which would impact density) and near-linear and symmetric operation in both directions. This method involves applying the right voltage conditions to the rows and columns of the array in the two different configurations (forward and reverse read) such that the current sensed in both directions is near-identical while at the same time avoiding leakage currents in any of the cells not being sensed.

FIGS. 3(A)-3(B) depict layers of a perceptron as implemented in a prior art resistive crossbar array, with the physics of the devices implementing multiplication, and current summation implementing accumulation. Particularly, FIG. 3(A) depicts the forward evaluate and FIG. 3(B) depicts the reverse evaluate operations as implemented on a crossbar array. Each weight $w_{ij}$ is encoded into the difference of two conductances $G^+_{ij}$ and $G^-_{ij}$. There is one access transistor per crosspoint. Wires connected to the gates of these transistors are called Word Lines (WL). Wires connecting to the node of the transistor that is not the gate, and not connected to an analog memory element, are called horizontal bit lines (BLH). Wires connecting to one of the terminals of the non-volatile memory which is not the node connected to an access transistor are called vertical bit lines (BLV).

In FIG. 3(A), during Forward Evaluate, the input neuron activations are encoded into pulse widths that arrive along the word lines. These pulse widths are active high, i.e., the OFF-state is at 0V, and the ON-state is a high voltage (which, in one non-limiting example, is 1.2V but will vary depending on the exact circuit and technology). The BLH wires are all at ground, and the BLV voltages are held at VREAD by a source follower device in the periphery (not shown). $i_j^+(t)$ and $i_j^-(t)$ are the instantaneous currents flowing through the BLVs. The difference between these currents is integrated on to a capacitor (not shown), to produce the $\Sigma w_{ij} x^A_i$ term in the forward propagate equation.

In FIG. 3(B), during Reverse Evaluate, the output neuron errors are encoded into pulse widths that arrive along the BLVs. These pulse widths are active low, i.e., the ON-state is at 0V, and the OFF-state is a high voltage (which, in one non-limiting example, is 1.2V, but will vary depending on the exact circuit and technology). The WL wires are all at the source follower voltage VRDP (VRDP is referred to as the read drain bias potential). $i_j^+(t)$ are the instantaneous currents flowing through the BLHs. The current is added to a capacitor in the periphery (not shown). $i_j^-(t)$ are generated in a separate time step and subtracted from the capacitor. The final voltage on the capacitor thus represents $\Sigma w_{ij} \delta^B_j$ in the reverse evaluate equation.

Embodiments of the present invention are an improvement over such prior art systems and methods.

SUMMARY OF THE INVENTION

In one embodiment, the present invention provides a circuit for both forward and reverse read operations on a neuromorphic crossbar array that is part of an artificial neural network (ANN), the circuit comprising: (a) a cell access transistor for each cell of the ANN, a gate terminal of the cell access transistor connected to a word line (WL) of the array, wherein the cell access transistor, in a forward read operation, carries a pulse width signal encoding an activation of a single neuron in the ANN; (b) a source-follower transistor for each cell of the ANN, which in a forward read operation is biased at a source follower voltage (VRDP) to hold a column voltage node (BLV) at read voltage (VREAD), and which in a reverse read operation is disconnected, wherein a variable resistor connects the cell access transistor and the source-follower transistor, the variable resistor implementing a portion or entirety of a synaptic weight in the ANN; and wherein the cell access transistor, in a reverse read operation, operates as another source follower by: encoding a neuron error signal into the column voltage node BLV, driving a gate line of the cell access transistor to the source follower voltage VRDP, and holding an intermediate node between the cell access transistor of (a) and the source-follower transistor of (b) at the read voltage VREAD.

In another embodiment, the present invention provides a circuit for both forward and reverse read operations on a neuromorphic crossbar array that is part of an artificial neural network (ANN), wherein a synaptic weight of each synapse in the ANN is represented by a pair of conductances, G+ and G−, respectively, the circuit comprising: (a) a cell access transistor for each cell of the ANN, a gate terminal of the cell access transistor connected to a word line (WL) of the array, wherein the cell access transistor, in a forward read operation, carries a pulse width signal encoding an activation of a single neuron in the ANN; (b) a source-follower transistor for each cell of the ANN, which in a forward read operation is biased at a source follower voltage (VRDP) to hold a column voltage node (BLV) at read voltage (VREAD), and which in a reverse read operation is disconnected; (c) a resistive element connecting the cell access transistor and the source follower transistor, wherein the conductance of the resistive element represents either the positive weight contribution conductance, G+, or the negative weight contribution conductance, G−; wherein the cell access transistor, in a reverse read operation, operates as another source follower by: encoding a neuron error signal into the column voltage node (BLV), driving a gate line of the cell access transistor to the source follower voltage (VRDP), and holding an intermediate node between the cell access transistor of (a) and the source-follower transistor of (b) at the read voltage (VREAD), and wherein the OFF-state column voltage node (BLV) is picked to be larger than the source follower voltage (VRDP) to eliminate current leakage, and the ON-state column voltage of node (BLV) is picked to be GND so that a current versus conductance behavior is linear over a predetermined range of conductance values.

In yet another embodiment, the present invention provides a method for both forward and reverse read operations in a neuromorphic crossbar array that is part of an artificial neural network (ANN), the method comprising: (a) during a forward read operation, encoding a plurality of neuron activations into a pulse width drive array word line that gates a cell access transistor; (b) biasing a source-follower transistor at a source follower voltage (VRDP) and holding a column voltage node (BLV) at read voltage (VREAD); and (c) during a reverse read operation, operating the cell access transistor as another source follower by: encoding a neuron error signal into the column voltage node (BLV), driving a gate line of the cell access transistor to the source follower voltage (VRDP), and holding an intermediate node between the cell access transistor of (a) and the source-follower transistor of (b) at the read voltage (VREAD).

In another embodiment, the present invention provides a method for executing both forward and reverse read operations on a neuromorphic crossbar array, the array including (i) synaptic cells having analog resistive synaptic elements in series with respective transistors and (ii) horizontal and vertical inputs, wherein certain synaptic cells are to conduct current while the other synaptic cells are to conduct less current, the method comprising: applying voltage pulses to the horizontal and vertical inputs of the array, so that said certain synaptic cells conduct current, while said other cells have leakage currents whose sum is less than a fraction of the sum of the currents through said selected synaptic cells.

BRIEF DESCRIPTION OF THE DRAWINGS

The present disclosure, in accordance with one or more various examples, is described in detail with reference to the following figures. The drawings are provided for purposes of illustration only and merely depict examples of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

DESCRIPTION OF THE PREFERRED EMBODIMENTS

Figure 1:
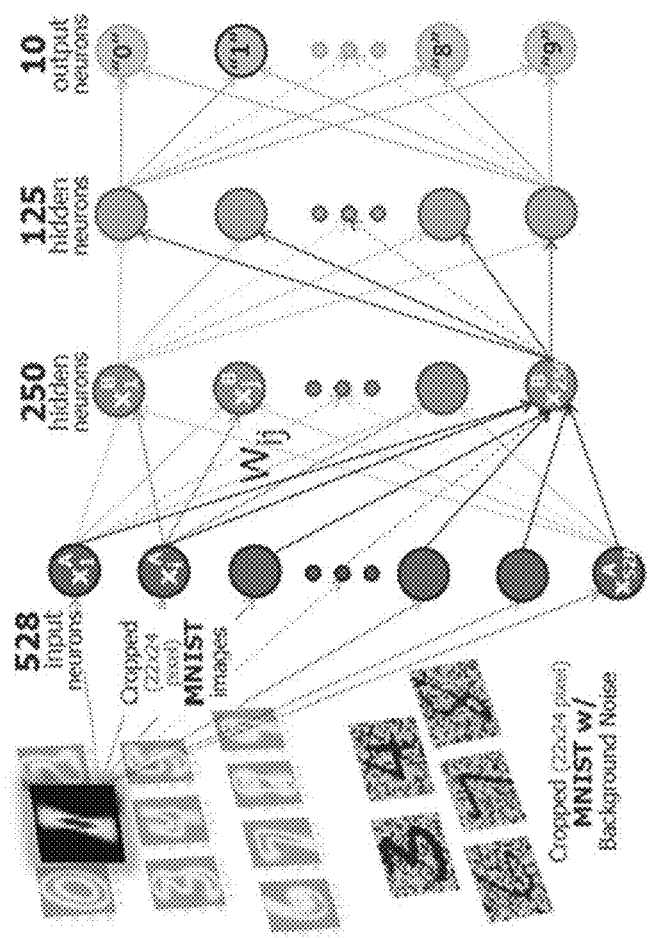
FIG. 1 shows multilayer perceptrons that can be trained using backpropagation for tasks such as image recognition, speech recognition and machine translation (to name a few).
Figure 2:
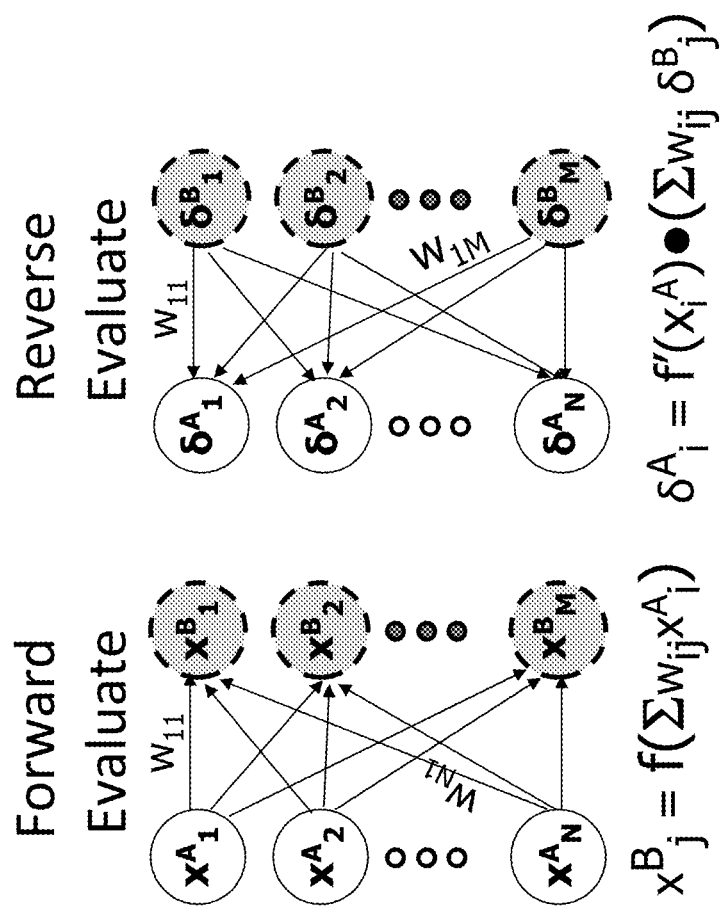
FIG. 2 illustrates that during training, multiply-accumulate operations need to occur for both forward and reverse evaluation.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional to specifications for its construction and is not intended to limit the invention to the embodiment illustrated. Those skilled in the art will envision many other possible variations within the scope of the present invention.

Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those of ordinary skill in the art. Thus, the present invention can include any variety of combinations and/or integrations of the embodiments described herein.

Figure 4:
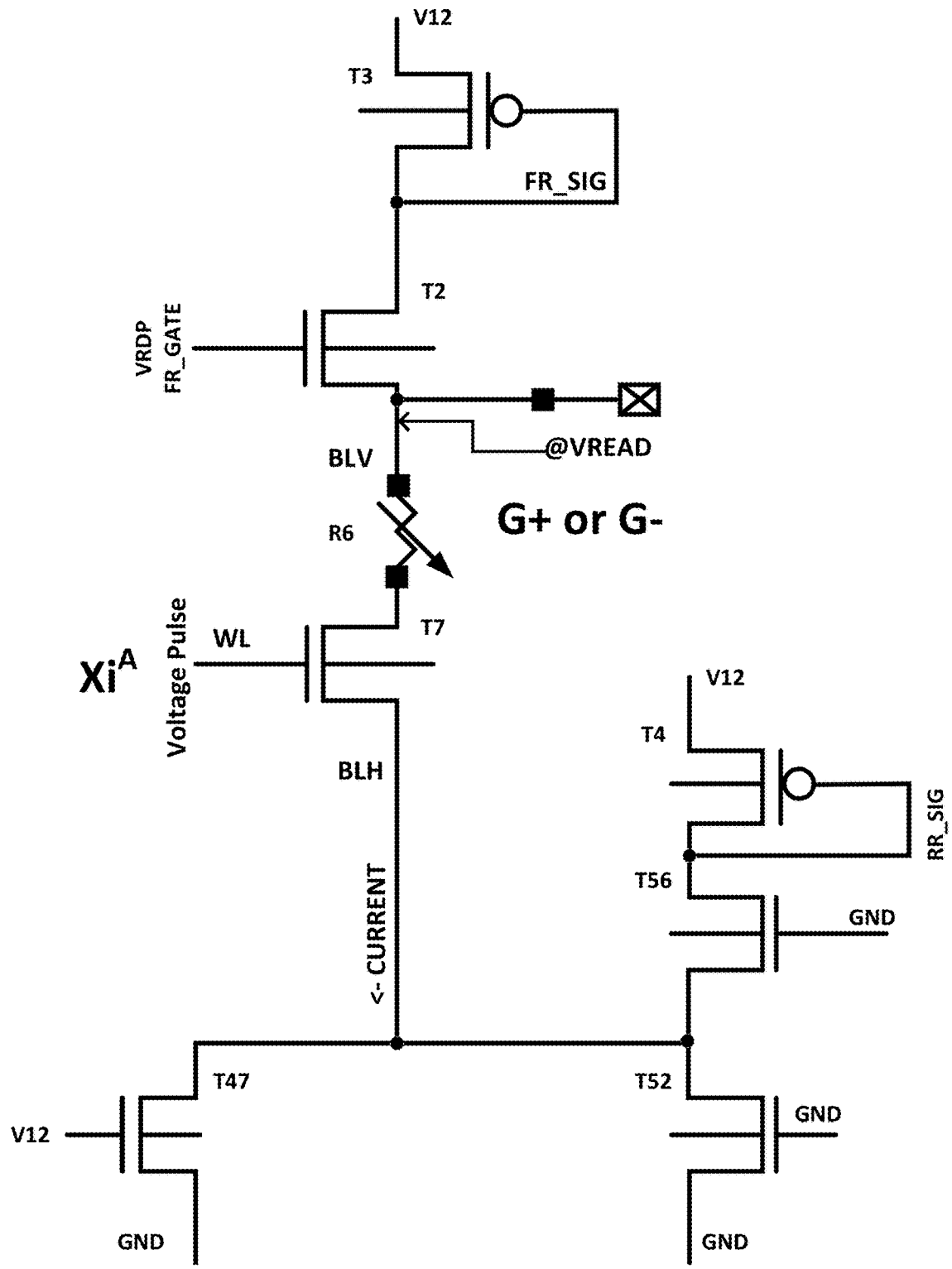
FIG. 4 illustrates circuit implementation of forward read.

FIG. 4 depicts the circuitry for doing read-out in one direction like prior art on memory circuit design. FIG. 4 depicts multiply accumulate operation for forward propagate, say along columns (labeled here as BLV, or vertical bit-lines). In FIG. 4: (1) T3 is a current mirror device, which is operating in saturation mode, and is used to mirror the current flowing into the circuit on to another branch connected to a capacitor (not shown); (2) T2 is a source follower device, whose gate is at VRDP that maintains the BLV voltage at or near VREAD; (3) R6 is a variable resistor representing a conductance; (4) T7 is an access transistor, whose gate node is connected to a word line (WL); (5) T47 is a switch device that holds BLH at 0V for forward evaluate; and (6) T4, T56 and T52 are disconnected.

Neuron activations ($x_i^A$) encoded into pulse widths drive array word lines (WL) that run in the horizontal direction (i.e., along rows) gating access transistors (T7). The duration of the ON pulse corresponds to the amount of time for which all crosspoints along the row are conducting current. A source-follower device (T2) biased at VRDP holds the column voltage node (BLV) at VREAD, even as the instantaneous current through that column varies based on the number of active neurons and the conductances to which they are connected. This current is mirrored and integrated onto a capacitor (not shown), whose final voltage reflects the accumulated forward propagate sum.

Figure 3B:
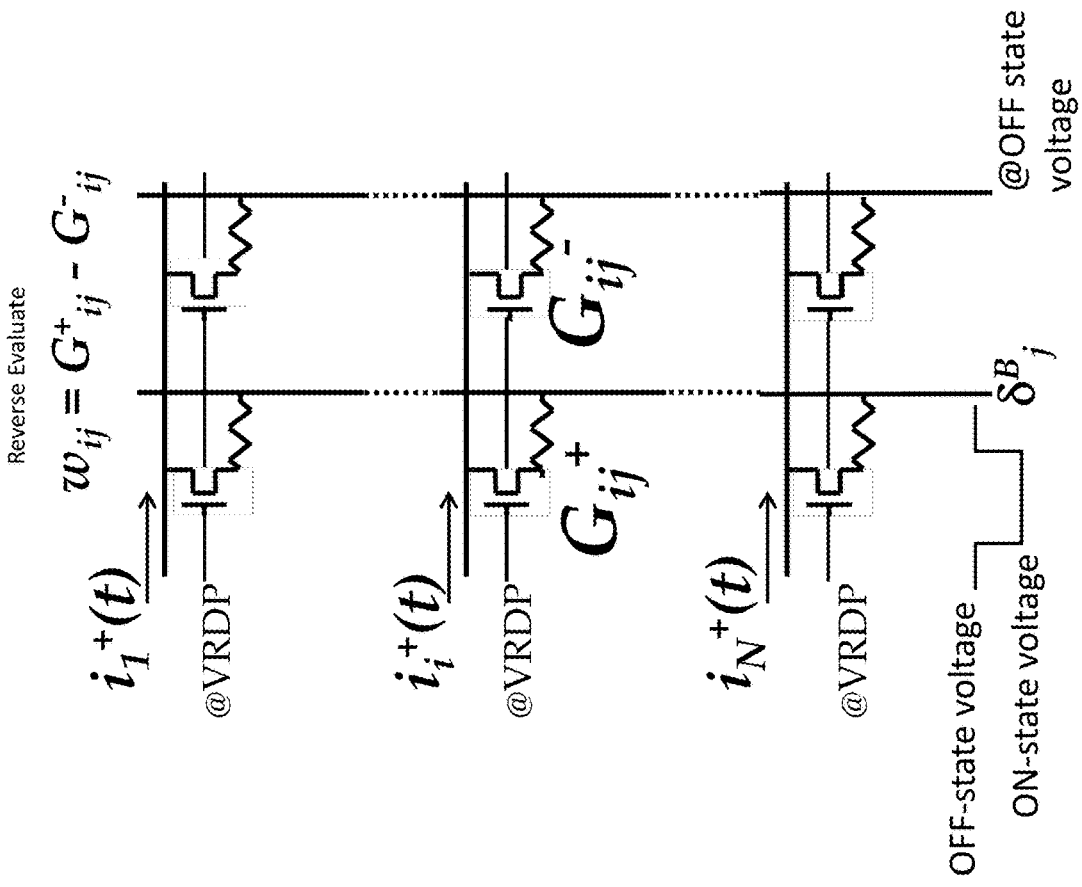
FIGS. 3(A)-(B) depict layers of a perceptron that can be implemented on resistive crossbar arrays, with the physics of the devices implementing multiplication, and current summation implementing accumulation.
Figure 3A:
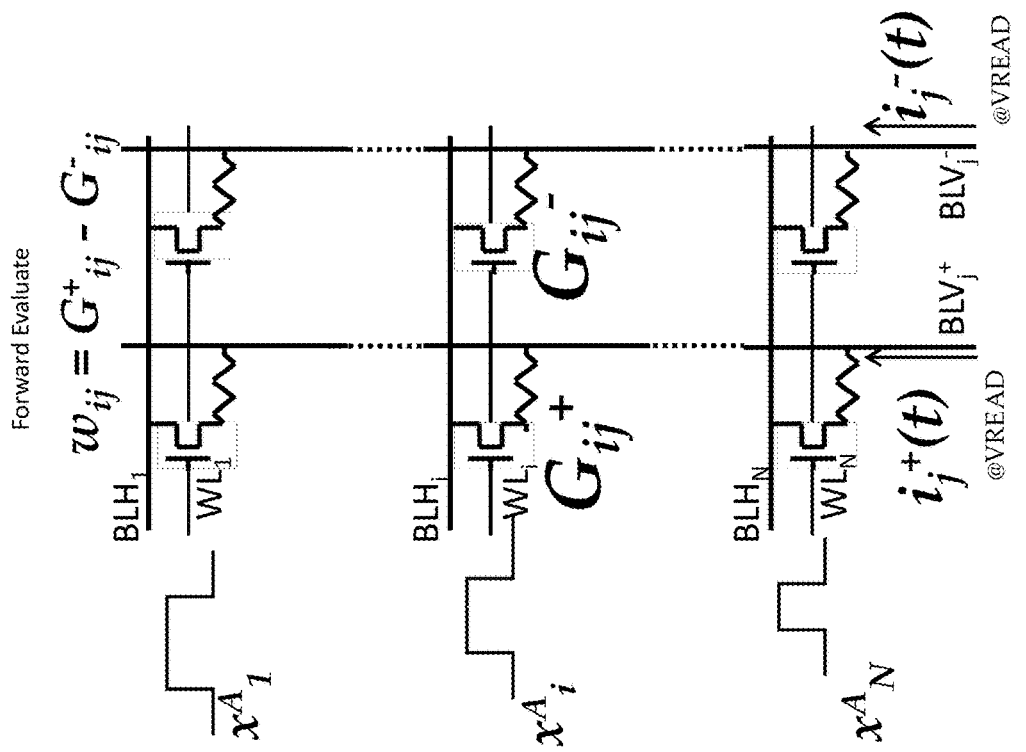
Figure 5:
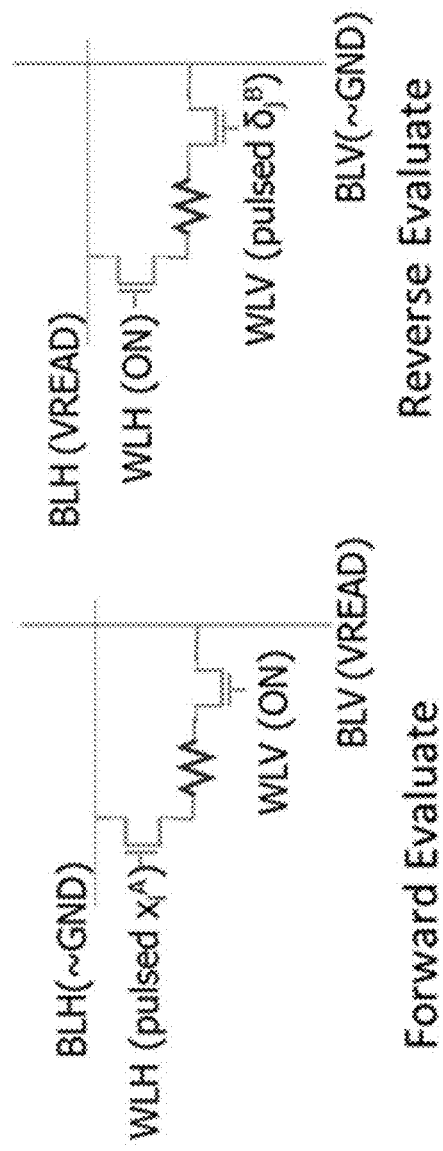
FIG. 5 illustrates an extension of forward read idea for reverse read.

It is possible to use a very similar implementation for reverse read, for example, by adding a second access transistor to every cell, that is driven by a vertical word line, as shown in FIG. 5. FIG. 5 shows one method to make sure that the current through a single crosspoint is the same, whether doing forward or reverse evaluate. This is referred to within this disclosure as a 'symmetric' cell. This is accomplished by using an extra word line per column—where now word lines are designated as WLH and WLV for horizontal and vertical, just like the bitlines, and by adding a transistor to each crosspoint (2T1R). During forward evaluate, the transistor gated by WLV will be always ON making it very low resistance, and in effect operating just like the circuits described in FIG. 4 and FIG. 3(A).

During reverse evaluate, the transistor gated by WLH will be always ON. The output error will be encoded into an active high pulse sent along WLVs, and the roles of BLH and BLV will be swapped ensuring that the current contributions are identical to the forward read case.

This would be a fully symmetric circuit for forward and reverse. In the forward read, this second access transistor would be fully ON. In the reverse read, the second transistor's gate would be driven by the magnitude of the reverse propagated signal, whereas the first access transistor will be fully ON. However, this extension has the drawback that it significantly increases the memory cell area (1T1R to 2T1R).

Figure 6:
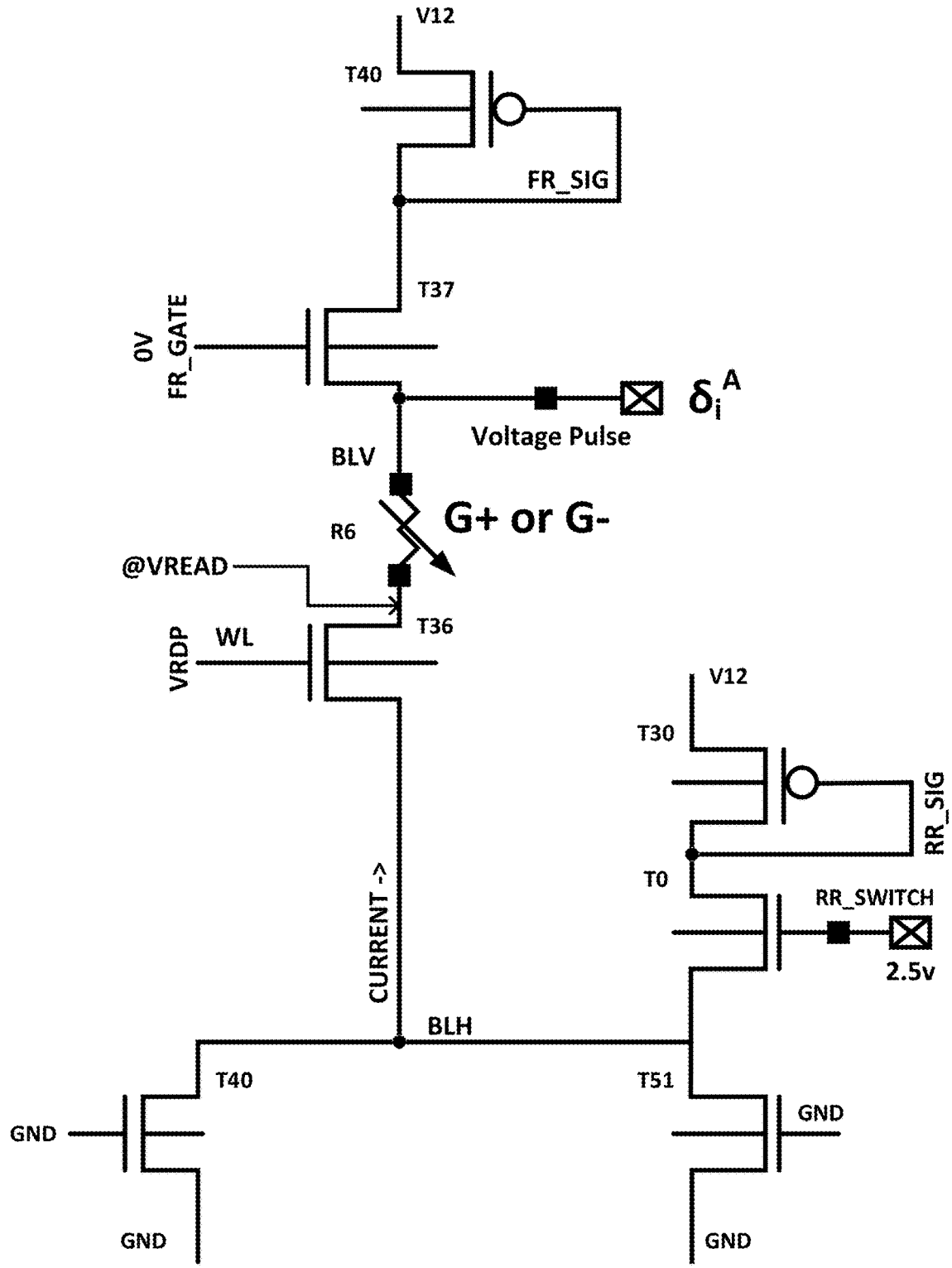
FIG. 6 illustrates by implementing a transistor device as a source follower, it is possible to implement both forward and reverse reads without additional access transistors.

Instead, the present invention's apparatus uses the original cell access transistor (T36 in FIG. 6) to also fill the role of the source follower. FIG. 6 shows a circuit implementing the reverse evaluate scenario shown in FIG. 3(B). The mirror (T40) and source follower (T37) attached to BLV are disconnected. BLV is instead driven by an 5 active low pulse (shown here with OFF/ON voltage levels of 0.6V/0V) that represents the output neuron error. R6 is a variable resistor representing a conductance. The cell access transistor T36 becomes the source follower, holding the intermediate node between T36 and R6 at or near VREAD. This causes current to flow from BLH towards BLV during the active low phase of the output error pulse width. T0 is a switch device connecting 10 BLH to a current mirror device (T30) which is operating in saturation. The mirrored current is integrated on to a capacitor (not shown). The switch device to ground BLH for forward read (T40), and the other switch device T51 are turned OFF.

Accordingly, in this scenario, the neuron error signal pulse-width is encoded into the column bit-line voltage (BLV). All gate lines of all the cell array transistors are driven to VRDP, and the intermediate node of the 1T1R cell is held near VREAD, ensuring that the current in the cell is directly proportional to the conductance of the resistive element. Furthermore, by choosing the high voltage level of the BLV pulse to be larger than VRDP, it is possible to eliminate leakage through unselected cells by driving their access/source follower transistors into cut-off. This enables 'near-linear' current vs. conductance behavior across a wide range of conductance values relevant to neural network training.

In one embodiment, the present invention provides a circuit for both forward and reverse read operations on a neuromorphic crossbar array that is part of an artificial neural network (ANN), the circuit comprising: (a) a cell access transistor for each cell of the ANN, a gate terminal of the cell access transistor connected to a word line (WL) of the array, wherein the cell access transistor, in a forward read operation, carries a pulse width signal encoding an activation of a single neuron in the ANN; (b) a source-follower transistor for each cell of the ANN, which in a forward read operation is biased at a source follower voltage (VRDP) to hold a column voltage node (BLV) at read voltage (VREAD), and which in a reverse read operation is disconnected, wherein a variable resistor connects the cell access transistor and the source-follower transistor, the variable resistor implementing a portion or entirety of a synaptic weight in the ANN; and wherein the cell access transistor, in a reverse read operation, operates as another source follower by: encoding a neuron error signal into the column voltage node (BLV), driving a gate line of the cell access transistor to the source follower voltage (VRDP), and holding an intermediate node between the cell access transistor of (a) and the source-follower transistor of (b) at the read voltage (VREAD).

In another embodiment, the present invention provides a circuit for both forward and reverse read operations on a neuromorphic crossbar array that is part of an artificial neural network (ANN), wherein a synaptic weight of each synapse in the ANN is represented by a pair of conductances, G+ and G−, respectively, the circuit comprising: (a) a cell access transistor for each cell of the ANN, a gate terminal of the cell access transistor connected to a word line (WL) of the array, wherein the cell access transistor, in a forward read operation, carries a pulse width signal encoding an activation of a single neuron in the ANN; (b) a source-follower transistor for each cell of the ANN, which in a forward read operation is biased at a source follower voltage (VRDP) to hold a column voltage node (BLV) at read voltage (VREAD), and which in a reverse read operation is disconnected; (c) a resistive element connecting the cell access transistor and the source follower transistor, wherein the conductance of the resistive element represents either the positive weight contribution conductance, G+, or the negative weight contribution conductance, G−; wherein the cell access transistor, in a reverse read operation, operates as another source follower by: encoding a neuron error signal into the column voltage node (BLV), driving a gate line of the cell access transistor to the source follower voltage (VRDP), and holding an intermediate node between the cell access transistor of (a) and the source-follower transistor of (b) at the read voltage (VREAD), and wherein the OFF-state column voltage node (BLV) is picked to be larger than the source follower voltage (VRDP) to eliminate current leakage, and the ON-state column voltage of node BLV is picked to be GND so that a current versus conductance behavior is linear over a predetermined range of conductance values.

In yet another embodiment, the present invention provides a method for both forward and reverse read operations in a neuromorphic crossbar array that is part of an artificial neural network (ANN), the method comprising: (a) during a forward read operation, encoding a plurality of neuron activations into a pulse width drive array word line that gates a cell access transistor; (b) biasing a source-follower transistor at a source follower voltage (VRDP) and holding a column voltage node (BLV) at read voltage to (VREAD); and (c) during a reverse read operation, operating the cell access transistor as another source follower by: encoding a neuron error signal into the column voltage node (BLV), driving a gate line of the cell access transistor to the source follower voltage (VRDP), and holding an intermediate node between the cell access transistor of (a) and the source-follower transistor of (b) at the read voltage (VREAD).

In another embodiment, the present invention provides a method for executing both forward and reverse read operations on a neuromorphic crossbar array, the array including (i) synaptic cells having analog resistive synaptic elements in series with respective transistors and (ii) horizontal and vertical inputs, wherein certain synaptic cells are to conduct current while the other synaptic cells are to conduct less current, the method comprising: applying voltage pulses to the horizontal and vertical inputs of the array, so that said certain synaptic cells conduct current, while said other cells have leakage currents whose sum is less than a fraction of the sum of the currents through said selected synaptic cells.

Figure 7:
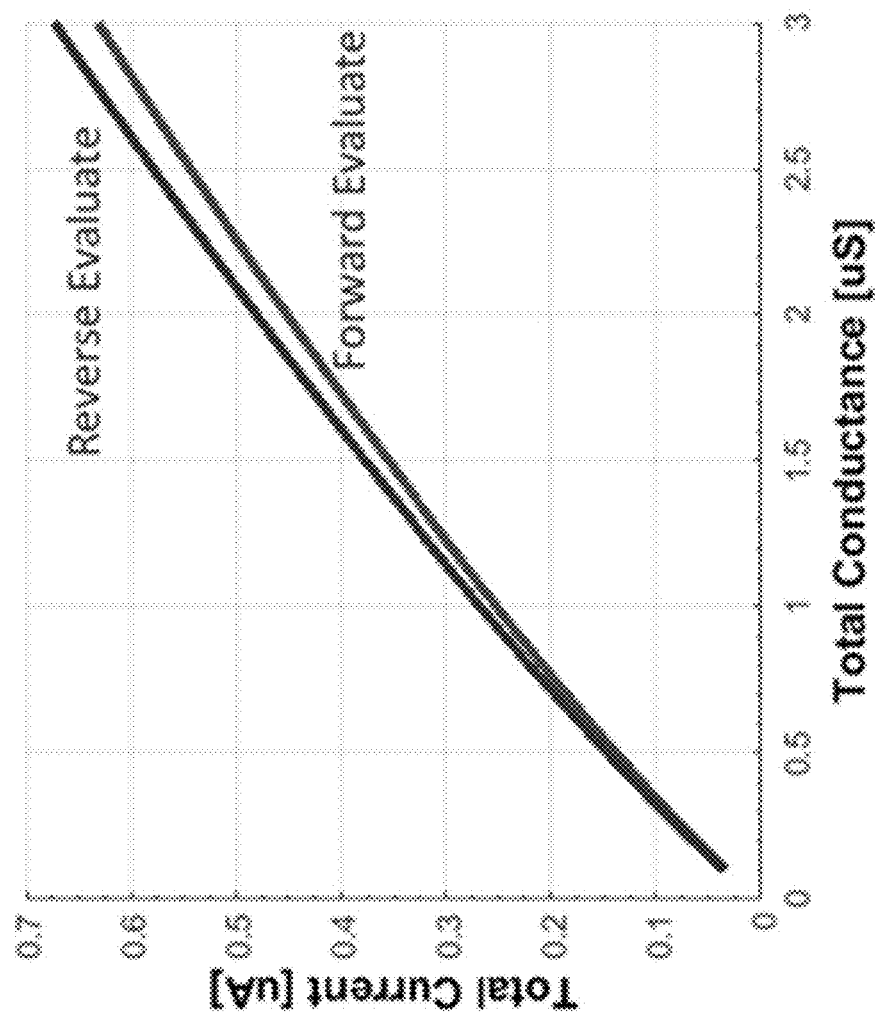
FIG. 7 shows circuit simulation showing near identical sensed current in the circuit when configured for forward and reverse evaluate operations, respectively.

The present invention shows that the current flow when the circuit is configured in Source Follower/Reverse evaluate mode (FIG. 6) is nearly-identical to when it is configured in forward read/forward evaluate mode (FIG. 4), when the right source follower voltage (VRDP in FIG. 6) is chosen, across a range of conductances for the R6 resistor. The results are shown in FIG. 7, which plots R6 conductance on the X-axis and the current that is sensed on the Y axis for the two modes, validating the present invention.

CONCLUSION

A system and method have been shown in the above embodiments for executing forward and reverse propagate operations on resistive crossbar array-based neural networks. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. A circuit for both forward and reverse read operations on a neuromorphic crossbar array that is part of an artificial neural network (ANN), the circuit comprising:
   (a) a cell access transistor for each cell of the ANN, a gate terminal of the cell access transistor connected to a word line (WL) of the array, wherein the cell access transistor, in a forward read operation, carries a pulse width signal encoding an activation of a single neuron in the ANN;
   (b) a source-follower transistor for each cell of the ANN, which in a forward read operation is biased at a source follower voltage (VRDP) to hold a column voltage node (BLV) at read voltage (VREAD), and which in a reverse read operation is disconnected, wherein a variable resistor connects the cell access transistor and the source-follower transistor, the variable resistor implementing a portion or entirety of a synaptic weight in the ANN;
   and wherein the cell access transistor, in a reverse read operation, operates as another source follower by: encoding a neuron error signal into the column voltage node (BLV), driving the word line of the cell access transistor to the source follower voltage (VRDP), and holding an intermediate node between the cell access transistor of (a) and the source follower transistor of (b) at the read voltage (VREAD).

2. The circuit of claim 1, wherein an OFF-state voltage of the column voltage node (BLV) is to be larger than the source follower voltage (VRDP) to eliminate current leakage.

3. The circuit of claim 1, wherein neurons in the ANN are implemented with CMOS circuitry.

4. The circuit of claim 1, wherein the synaptic weight is implemented using an analog memory element.

5. The circuit of claim 4, wherein the analog memory element is a non-volatile memory (NVM) element.

6. The circuit of claim 5, wherein the NVM element is selected from the group consisting of: phase-change memory elements, resistive random access memory elements, and conducting bridge random access memory elements.

7. A circuit for both forward and reverse read operations on a neuromorphic crossbar array that is part of an artificial neural network (ANN), wherein a synaptic weight of each synapse in the ANN is represented by a pair of conductances, G+ and G-, respectively, the circuit comprising:
   (a) a cell access transistor for each cell of the ANN, a gate terminal of the cell access transistor connected to a word line (WL) of the array, wherein the cell access transistor, in a forward read operation, carries a pulse width signal encoding an activation of a single neuron in the ANN;
   (b) a source-follower transistor for each cell of the ANN, which in a forward read operation is biased at a source follower voltage (VRDP) to hold a column voltage node (BLV) at read voltage (VREAD), and which in a reverse read operation is disconnected;
   (c) a resistive element connecting the cell access transistor and the source follower transistor, wherein the conductance of the resistive element represents either the positive weight contribution conductance, G+, or the negative weight contribution conductance, G-; wherein the cell access transistor, in a reverse read operation, operates as another source follower by: encoding a neuron error signal into the column voltage node (BLV), driving the word line of the cell access transistor to the source follower voltage (VRDP), and holding an intermediate node between the cell access transistor of (a) and the source follower transistor of (b) at the read voltage (VREAD), and wherein an OFF-state voltage of the column voltage node (BLV) is to be larger than the source follower voltage (VRDP) to eliminate current leakage, and an ON-state voltage of the column voltage node (BLV) is to be at ground (GND) so that a current versus conductance behavior is linear over a predetermined range of conductance values.

8. The circuit of claim 7, wherein neurons in the ANN are implemented with CMOS circuitry.

9. The circuit of claim 7, wherein the synaptic weight of each synapse in the ANN is implemented using an analog memory element.

10. The circuit of claim 9, wherein the analog memory element is a non-volatile memory (NVM) element.

11. The circuit of claim 10, wherein the NVM element is selected from the group consisting of: phase-change memory elements, resistive random access memory elements, and conducting bridge random access memory elements.

12. A method for both forward and reverse read operations in a neuromorphic crossbar array that is part of an artificial neural network (ANN), the method comprising: (a) during a forward read operation, encoding a plurality of neuron activations into a pulse width drive array word line that gates a cell access transistor; (b) biasing a source-follower transistor at a source follower voltage (VRDP) and holding a column voltage node (BLV) at read voltage (VREAD); and (c) during a reverse read operation, operating the cell access transistor as another source follower by: encoding a neuron error signal into the column voltage node (BLV), driving the word line of the cell access transistor to the source follower voltage (VRDP), and holding an intermediate node between the cell access transistor of (a) and the source follower transistor of (b) at the read voltage (VREAD).

13. The method of claim 12, wherein a voltage of the column voltage node (BLV) is to be larger than the source follower voltage (VRDP) to eliminate current leakage.

14. The method of claim 12, wherein neurons in the ANN are implemented with CMOS circuitry.

15. The method of claim 12, wherein a synaptic weight of each synapse in the ANN is implemented using an analog memory element.

16. The method of claim 15, wherein the analog memory element is a non-volatile memory (NVM) element.

17. The method of claim 16, wherein the NVM element is selected from the group consisting of: phase-change memory element, resistive random access memory element, and conducting bridge random access memory element.

18. A method for executing both forward and reverse read operations on a neuromorphic crossbar array, the array including
(i) first and second sets of synaptic cells having analog resistive synaptic elements in series with respective transistors and
(ii) horizontal and vertical inputs, wherein the first set of synaptic cells are to conduct current while the second set of synaptic cells are to conduct less current, the method comprising: applying voltage pulses to the horizontal and vertical inputs of the array, so that the first set of synaptic cells conduct current, while the second set of synaptic cells have leakage currents whose sum is less than a fraction of the sum of the currents through the second set of synaptic cells.

19. The method of claim 18, wherein reverse read operations are achieved by applying pulses to vertical bit-lines, while applying a constant voltage to a gate terminal of the transistor, the constant voltage being selected so that either:
(i) currents are allowed to pass through the first set of synapatic cells, wherein the transistors in the first set of synaptic cells are operating in source-follower mode, or
(ii) the transistors in the second set of synaptic cells are operating in cut-off mode, thereby reducing the leakage currents through them.

20. The method of claim 18, wherein the method is implemented in an artificial neural network, with neurons in the ANN are implemented with CMOS circuitry.

21. The method of claim 18, wherein the method is implemented in an artificial neural network, with a synaptic weight of each synapse in the ANN is implemented using an analog memory element.

22. The method of claim 21, wherein the analog memory element is a non-volatile memory (NVM) element.

23. The method of claim 22, wherein the NVM element is selected from the group consisting of: phase-change memory element, resistive random access memory element, and conducting bridge random access memory element.

* * * * *